(12) United States Patent
Akimoto et al.

(10) Patent No.: US 11,276,812 B2
(45) Date of Patent: Mar. 15, 2022

(54) PIEZOELECTRIC MEMBER

(71) Applicant: Hitachi Metals, Ltd., Tokyo (JP)

(72) Inventors: Katsuya Akimoto, Tokyo (JP); Yukio Ikeda, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 634 days.

(21) Appl. No.: 16/209,190

(22) Filed: Dec. 4, 2018

(65) Prior Publication Data

US 2019/0252596 A1     Aug. 15, 2019

(30) Foreign Application Priority Data

Feb. 9, 2018    (JP) .............................. JP2018-021859

(51) Int. Cl.
*H01L 41/047* (2006.01)
*H01L 41/087* (2006.01)
*H01L 41/113* (2006.01)

(52) U.S. Cl.
CPC ........ *H01L 41/0477* (2013.01); *H01L 41/087* (2013.01); *H01L 41/1132* (2013.01)

(58) Field of Classification Search
CPC .. H01L 41/0477; H01L 41/087; H01L 41/082
See application file for complete search history.

(56) References Cited

U.S. PATENT DOCUMENTS

| | | | | |
|---|---|---|---|---|
| 4,695,988 A | * | 9/1987 | Banno | G01V 1/208 310/800 |
| 4,849,946 A | * | 7/1989 | Beauducel | G01L 23/10 367/155 |
| 5,554,907 A | * | 9/1996 | Dixon | G08G 1/02 310/319 |
| 5,598,133 A | * | 1/1997 | Fuse | H03H 9/1028 310/348 |

(Continued)

FOREIGN PATENT DOCUMENTS

| JP | 54-99086 U | 7/1979 |
|---|---|---|
| JP | 63-121465 U | 8/1988 |

(Continued)

OTHER PUBLICATIONS

Japanese-language Office Action issued in Japanese Application No. 2018-021859 dated Jun. 1, 2021 with English translation (10 pages).

*Primary Examiner* — Bryan P Gordon
(74) *Attorney, Agent, or Firm* — Crowell & Moring LLP (57) ABSTRACT

A piezoelectric body that is excellent in endurance, flexibility and bendability is achieved. A piezoelectric member includes: belt type first and second conductive rubber sheets that face each other; and a piezoelectric layer formed between an upper surface of the first conductive rubber sheet and a lower surface of the second conductive rubber sheet. The piezoelectric layer is made of a piezoelectric coating material with which at least either one of the upper surface of the first conductive rubber sheet and the lower surface of the second conductive rubber sheet is coated. When a (Continued)

pressure is applied to the piezoelectric layer through at least either one of the first conductive rubber sheet and the second conductive rubber sheet, a potential difference is generated between the first conductive rubber sheet and the second conductive rubber sheet.

10 Claims, 10 Drawing Sheets

(56) References Cited

U.S. PATENT DOCUMENTS

| | | | |
|---|---|---|---|
| 2015/0163598 A1* | 6/2015 | Abe | H01L 41/053 381/114 |
| 2015/0280102 A1 | 10/2015 | Tajitsu et al. | |
| 2018/0358541 A1* | 12/2018 | Tajitsu | D03D 15/00 |

FOREIGN PATENT DOCUMENTS

| | | |
|---|---|---|
| JP | 64-50488 A | 2/1989 |
| JP | 2000-321150 A | 11/2000 |
| JP | 2009-145193 A | 7/2009 |
| JP | 2017-89247 A | 5/2017 |
| WO | WO 2014/058077 A1 | 4/2014 |

\* cited by examiner

PIEZOELECTRIC MEMBER

CROSS-REFERENCE TO RELATED APPLICATION

The present application claims priority from Japanese Patent Application No. 2018-21859 filed on Feb. 9, 2018, the content of which is hereby incorporated by reference into this application.

TECHNICAL FIELD OF THE INVENTION

The present invention relates to a piezoelectric member generating a voltage when a pressure is applied thereto. More particularly, the present invention relates to a piezoelectric member that is suitable to be used as a sensor and a power generating element.

BACKGROUND OF THE INVENTION

Japanese Patent Application Laid-open Publication No. 2017-89247 (Patent Document 1, see paragraphs [0031], [0037] and [0041] and FIG. 1) discloses a door-nipping detector that detects door nipping in a vehicle door. This detection device includes a door end rubber formed on an edge of a door board and a piezoelectric member functioning as a foreign-smatter detection sensor formed inside the door end rubber. The piezoelectric member includes a piezoelectric rubber formed by dispersing piezoelectric particles, a pair of electrodes each of which is formed along a longitudinal direction of the piezoelectric rubber, and a wiring connected to each of the pair of electrodes.

Japanese Patent Application Laid-open Publication No. 2000-321150 (Patent Document 2, see paragraphs [0076] and [0088] and FIG. 23) discloses a pinching detection sensor including a piezoelectric member and an electrode layered on the piezoelectric member. The Patent Document 2 describes that the electrode is made of a conductive rubber so as to have bendability. In addition, the Patent Document 2 discloses a coaxial-cable type pinching sensor including a center electrode, a piezoelectric member formed in a periphery of the center electrode, an outer-layer electrode formed in a periphery of the piezoelectric member, and a covering member formed in a periphery of the outer-layer electrode.

SUMMARY OF THE INVENTION

However, each of related-art piezoelectric members and sensors disclosed in the Patent Documents 1 and 2 has the following problems.

In the piezoelectric member disclosed in the Patent Document 1, an electrode is formed on each of width-directional both ends (width-directional both side surfaces) of the piezoelectric rubber. Therefore, when an object whose size is equal to or larger than the width of the piezoelectric rubber is in contact with an upper surface or a lower surface of the piezoelectric rubber, a part of the object is in contact with the electrode beyond the piezoelectric rubber. And, the object is in contact with the piezoelectric rubber and the electrode at the same time over an interface between the piezoelectric rubber and the electrode. Therefore, there is a risk of direct application of a pressure to the electrode, which results in electrode breakage and peeling-off of the electrode from the piezoelectric rubber. While the Patent Document 1 does not specifically disclose a material of the electrode, a method of forming the electrode and others, it is not generally easy to form a metallic electrode on a surface of the piezoelectric rubber. It is particularly difficult to, on a surface of the piezoelectric rubber, form a metallic electrode following extension, shrinkage and bending of the piezoelectric rubber but not peeling off.

The coaxial-cable type pinching sensor disclosed in the Patent Document 2 is molded to have one cable shape formed of the center electrode, the piezoelectric member, the outer-layer electrode and the covering member. Therefore, increases in cross-sectional areas of the center electrode and the outer-layer electrode for decreasing electric resistances of the center electrode and the outer-layer electrode directly lead to increase in a diameter of the cable type pinching sensor, and lead to decrease in flexibility and bendability of this sensor.

The present invention has been made in consideration of the above-described problems, and an object of the present invention is to provide a piezoelectric member that is excellent in endurance, flexibility and bendability.

In an aspect of the present invention, the piezoelectric member includes a belt type first conductive rubber sheet and a belt type second conductive rubber sheet having respective main surfaces that face each other, and a piezoelectric layer formed between the main surface of the first conductive rubber sheet and the main surface of the second conductive rubber sheet. The piezoelectric layer is made of a piezoelectric coating material with which at least either one of the main surface of the first conductive rubber sheet and the main surface of the second conductive rubber sheet is coated. When a pressure is applied to the piezoelectric layer through at least either one of the first conductive rubber sheet and the second conductive rubber sheet, a potential difference is generated between the first conductive rubber sheet and the second conductive rubber sheet.

In another aspect of the present invention, the piezoelectric member includes first and second cable type piezoelectric bodies that are adjacent to each other. Each of the first and second cable type piezoelectric bodies includes a conductive rubber having a circular cross section, and a piezoelectric layer formed in an outer periphery of the conductive rubber. The piezoelectric layer is made of a piezoelectric coating material with which the outer periphery of the conductive rubber is coated. When a pressure is applied to at least either one of the piezoelectric layer of the first cable type piezoelectric body and the piezoelectric layer of the second cable type piezoelectric body, a potential difference is generated between the first cable type piezoelectric body and the second cable type piezoelectric body.

According to the present invention, a piezoelectric member that is excellent in endurance, flexibility, and bendability is achieved.

DESCRIPTIONS OF THE PREFERRED EMBODIMENTS

First Embodiment

As one example of embodiments of the piezoelectric member of the present invention, an object-pinching preventing sensor in a vehicle sliding door to which the present invention is applied will be described below.

Figure 1:
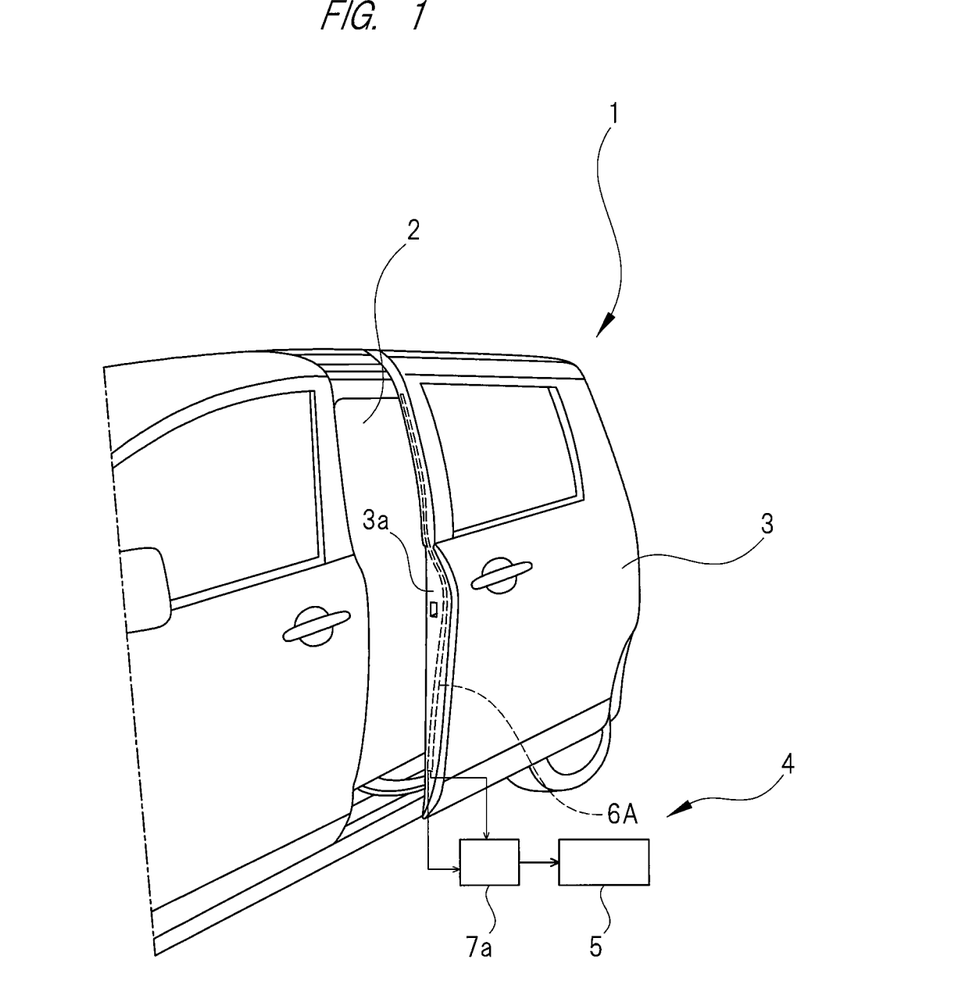
FIG. 1 is an explanatory diagram showing a first embodiment of the present invention.

A vehicle 1 shown in FIG. 1 is so-called mini-van type vehicle. An opening 2 for allowing a rider to get on and off a rear seat is formed on a side surface of this vehicle 1. This opening 2 is opened and closed by an electric-powered slide door 3 that is formed on the side surface of the vehicle 1 so as to be movable in front and rear directions of this vehicle 1. On the vehicle 1, a slide-door driving device 4 used to open and close the slide door 3 is installed. The slide-door driving device 4 mainly includes an actuator (not illustrated) having a speed reduction mechanism, a controller 5 controlling the actuator, a piezoelectric member 6A functioning as an object-pinching preventing sensor, and a voltage measuring unit 7a. In the following explanations, the piezoelectric member 6A is referred to as "pressure-sensitive sensor 6A".

The pressure-sensitive sensor 6A shown in FIG. 1 is attached to a front surface 3a of the slide door 3 while being enclosed inside a weather strip. Although illustration is omitted, the front surface 3a of the slide door 3 intricately curves. The pressure-sensitive sensor 6A is attached to the front surface 3a of the slide door while bending along the intricate curve of the front surface 3a of the slide door.

When any obstacle is pinched between the slide door 3 and the opening 2 while the slide door 3 is being driven to close, the obstacle is detected by the pressure-sensitive sensor 6A. Specifically, when the obstacle that is being caught between the slide door 3 and the opening 2 is in contact with the pressure-sensitive sensor 6A to apply a pressure to the pressure-sensitive sensor 6A, a voltage is output from the pressure-sensitive sensor 6A. The voltage output from the pressure-sensitive sensor 6A is input to a voltage measuring unit 7a that is electrically connected to the pressure-sensitive sensor 6A. The voltage measuring unit 7a to which the voltage has been input measures a value of the input voltage, and inputs a measurement result (measurement value) to a controller 5. The controller 5 compares the input measurement value and a predetermined threshold value (reference value). If the measurement value is larger than the reference value, the driving of the slide door 3 is stopped, or the slide door 3 is driven to open. Incidentally, there is also an embodiment of comparison between the measurement value and the reference value in the voltage measuring unit 7a. In this embodiment, if the measurement value exceeds the reference value, a predetermined signal is output from the voltage measuring unit 7a, and the signal is input to the controller 5. The controller 5 to which the signal has been input stops the driving of the slide door 3, or drives the slide door 3 so as to open.

Figure 2:
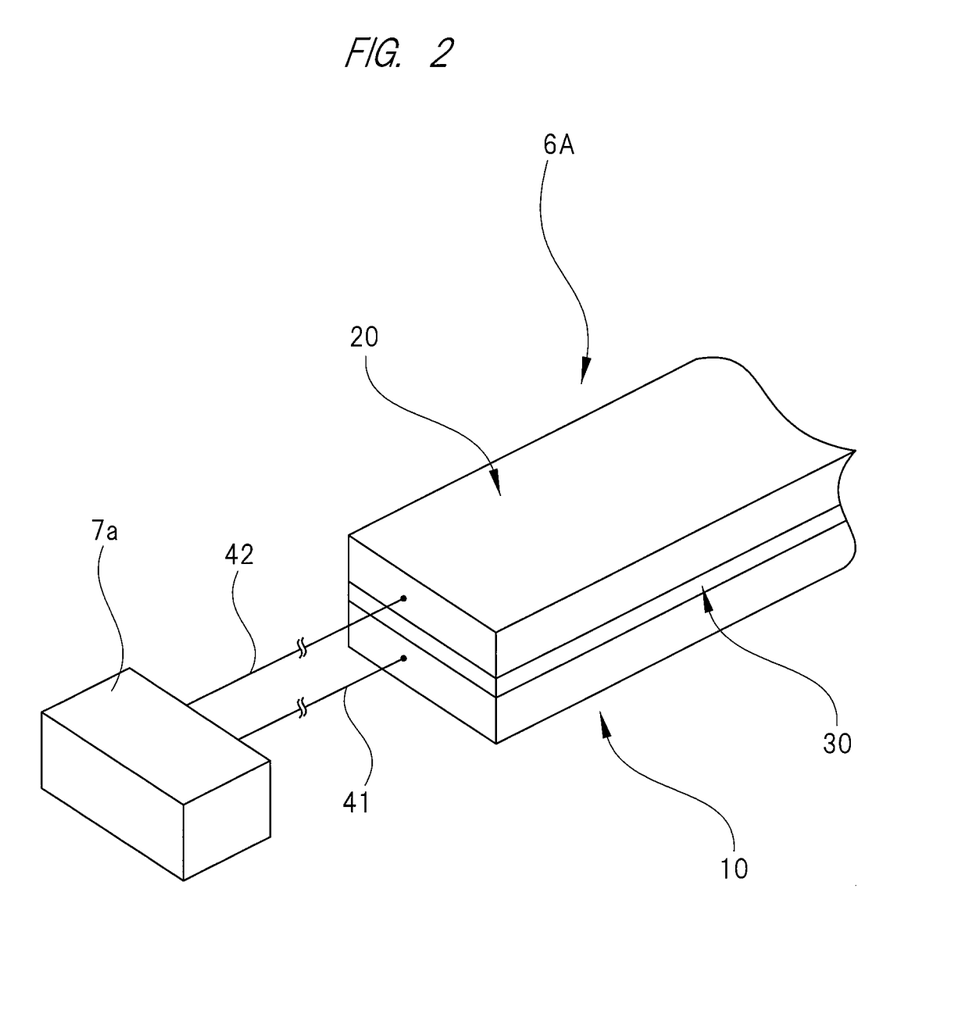
FIG. 2 is a perspective view of a pressure-sensitive sensor shown in FIG. 1.
Figure 3:
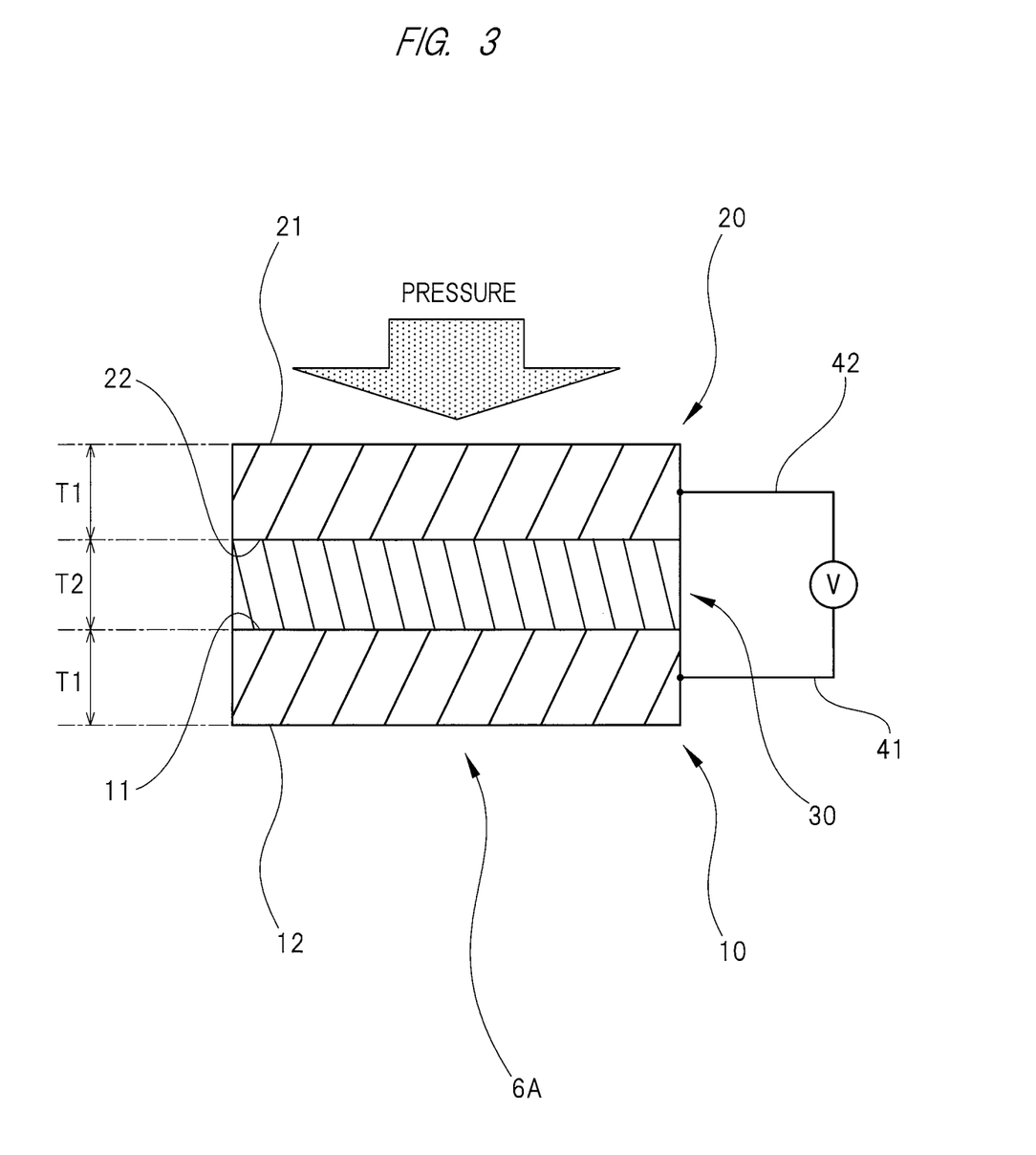
FIG. 3 is a cross-sectional view of the pressure-sensitive sensor shown in FIG. 1.

Next, the pressure-sensitive sensor 6A will be explained more in detail. As shown in FIGS. 2 and 3, the pressure-sensitive sensor 6A has a first conductive rubber sheet 10 and a second conductive rubber sheet 20 each having a belt shape with main surfaces that are opposite to each other. The first conductive rubber sheet 10 has a rectangular or a substantially rectangular cross-sectional shape, and includes an upper surface 11 that is one of main surfaces and a lower surface 12 that is the other of the main surfaces. Similarly, the second conductive rubber sheet 20 has a rectangular or a substantially rectangular cross-sectional shape, and includes an upper surface 21 that is one of main surfaces and a lower surface 22 that is the other of the main surfaces. In the present embodiment, the upper surface 11 that is one of the main surfaces of the first conductive rubber sheet 10 and the lower surface 22 that is one of the main surfaces of the second conductive rubber sheet 20 face each other. As a conductive rubber used for the conductive rubber sheets 10 and 20, a material that is formed by adding carbon particles to a mixture of thermoplastic elastomers (TPE) and polypropylene (PP) so that a volume resistivity is 0.05 Ω·cm to 0.10 Ω·cm can be used.

Further, a piezoelectric layer 30 is formed between the main surface of the first conductive rubber sheet 10 and the main surface of the second conductive rubber sheet 20 that face each other. Specifically, the piezoelectric layer 30 is formed between the upper surface 11 of the first conductive rubber sheet 10 and the lower surface 22 of the second conductive rubber sheet 20, and the upper surface 11 and the lower surface 22 are compressed and bonded to each other through the piezoelectric layer 30. This piezoelectric layer 30 is made of a piezoelectric coating material applied onto the upper surface 11 of the first conductive rubber sheet 10. More specifically, the piezoelectric layer 30 is made of a piezoelectric coating material that is sprayed onto the upper surface 11 of the first conductive rubber sheet 10 by using a spray gun. In other words, the piezoelectric layer 30 is a coating film of the piezoelectric coating material formed on the upper surface 11 of the first conductive rubber sheet 10. As the piezoelectric coating material, for example, a material formed by adding lead zirconate titanate (PZT) ceramic powders into an epoxy resin can be used.

Incidentally, the piezoelectric coating material forming the piezoelectric layer 30 may be applied onto at least either one of the main surface of the first conductive rubber sheet 10 and the main surface of the second conductive rubber sheet 20. That is, the piezoelectric layer 30 may be formed by spraying the piezoelectric coating material onto the lower surface 22 of the second conductive rubber sheet 20, or the piezoelectric layer 30 may be formed by spraying the piezoelectric coating material onto both of the upper surface 11 of the first conductive rubber sheet 10 and the lower surface 22 of the second conductive rubber sheet 20.

On the other hand, layers (such as an adhesive layer) that are not the piezoelectric layer 30 are not formed between the upper surface 11 of the first conductive rubber sheet 10 and the lower surface 22 of the second conductive rubber sheet 20. Incidentally, as long as electrical conduction between the first conductive rubber sheet 10 and the piezoelectric layer 30 and electrical conduction between the second conductive rubber sheet 20 and the piezoelectric layer 30 are not inhibited, the layers including the adhesive layer that are not the piezoelectric layer 30 may be formed between the upper surface 11 of the first conductive rubber sheet 10 and the lower surface 22 of the second conductive rubber sheet 20.

As shown in FIG. 2, an end of a lead wire 41 functioning as a first connecting wire is connected to an end surface of the first conductive rubber sheet 10. Similarly, an end of a lead wire 42 functioning as a second connecting wire is connected to an end surface of the second conductive rubber sheet 20. Each of the other ends of these lead wires 41 and 42 is connected to the voltage measuring unit 7a. In other words, the piezoelectric layer 30 that is electrically conducted with the first conductive rubber sheet 10 is connected to the voltage measuring unit 7a through the lead wire 41. That is, the first conductive rubber sheet 10 is one electrode for electrically connecting the piezoelectric layer 30 and the voltage measuring unit 7a, and the second conductive rubber sheet 20 is the other electrode for electrically connecting the piezoelectric layer 30 and the voltage measuring unit 7a.

As described above, the pressure-sensitive sensor 6A according to the present embodiment has a layered structure in which the first conductive rubber sheet 10, the piezoelectric layer 30 and the second conductive rubber sheet 20 are layered in this order. Therefore, as shown in FIG. 3, when a pressure is applied to the piezoelectric layer 30 through at least either one of the first conductive rubber sheet 10 and the second conductive rubber sheet 20, a potential difference (voltage) is generated between the first conductive rubber sheet 10 and the second conductive rubber sheet 20 by a piezoelectric effect. And, the potential difference (voltage) generated between the first conductive rubber sheet 10 and the second conductive rubber sheet 20 is measured by the voltage measuring unit 7a (FIGS. 1 and 2) connected to these conductive rubber sheets.

Note that each thickness (T1) of the first conductive rubber sheet 10 and the second conductive rubber sheet 20 shown in FIG. 3 is about several mm, and a thickness (T2) of the piezoelectric layer 30 is about 100 μm to 200 μm.

As described above, the pressure-sensitive sensor 6A according to the present embodiment has a pair of the first conductive rubber sheet 10 and the second conductive rubber sheet 20 that are flexible and has the piezoelectric layer 30 formed between the conductive rubber sheets 10 and 20, and the piezoelectric layer 30 is made of the piezoelectric coating material. Therefore, deformations of the first conductive rubber sheet 10 and the second conductive rubber sheet 20 are not inhibited by the piezoelectric layer 30, so that flexibility and bendability are excellent as a whole. The piezoelectric layer 30 can be formed by only applying the piezoelectric coating material onto the surfaces of the first conductive rubber sheet 10 and the second conductive rubber sheet 20, and therefore, the pressure-sensitive sensor 6A including the piezoelectric layer 30 can be easily manufactured in a short time.

Further, in the pressure-sensitive sensor 6A according to the present embodiment, each of the first conductive rubber sheet 10 and the second conductive rubber sheet 20 each having rubber elasticity functions as the electrode that electrically connects this pressure-sensitive sensor 6A and an external device (the voltage measuring unit 7a in the present embodiment). Therefore, a possibility of causing damage on an electrode by an external force is very low. The piezoelectric layer 30 that is the coating film made of the piezoelectric coating material flexibly follows the deformations (extension/shrinkage and bending) of the first conductive rubber sheet 10 and the second conductive rubber sheet 20 that are the electrodes. Therefore, a possibility of peeling off of the piezoelectric layer 30 from the first conductive rubber sheet 10 and the second conductive rubber sheet 20 that are the electrodes is also very low. Totally, the pressure-sensitive sensor 6A according to the present embodiment has excellent flexibility, bendability and endurance.

Second Embodiment

Figure 4:
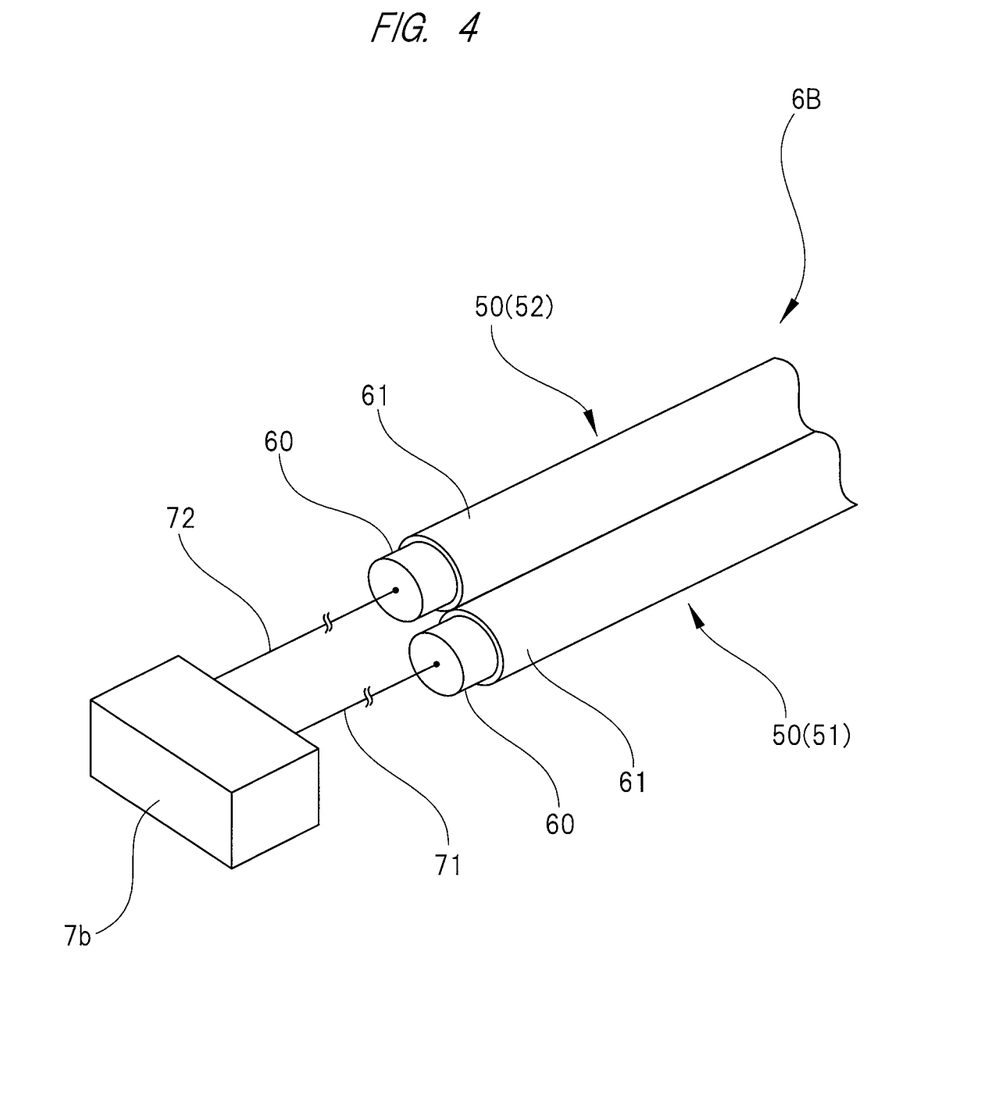
FIG. 4 is an explanatory diagram showing a second embodiment of the present invention.
Figure 5:
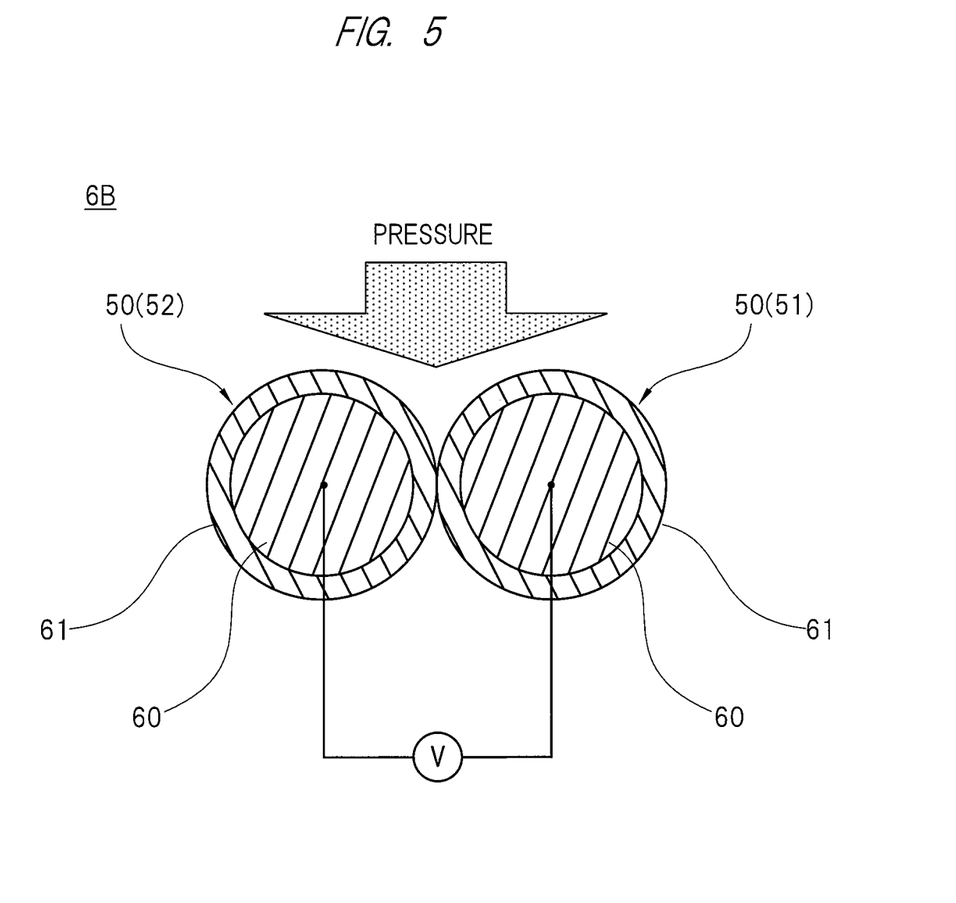
FIG. 5 is a cross-sectional view of a pressure-sensitive sensor shown in FIG. 4.

Next, another embodiment example of a piezoelectric member of the present invention will be explained in detail with reference to the drawings. As shown in FIGS. 4 and 5, a piezoelectric member 6B according to the present embodiment has a cable type first piezoelectric body 51 and a cable type second piezoelectric body that are adjacent to each other. The cable type first piezoelectric body 51 and the cable type second piezoelectric body 52 are arranged in parallel to each other, and each has an outer peripheral surface that is in contact with each other in an entire or a substantially entire length. Note that the cable type first piezoelectric body 51 and the cable type second piezoelectric body 52 have the same shape, the same structure, and the same dimension as each other. Therefore, in the following explanation, the cable type first piezoelectric body 51 and the cable type second piezoelectric body 52 may be collectively referred to as "cable type piezoelectric body 50" in some cases. And, in the following explanation, the piezoelectric member 6B according to the present embodiment may be referred to as "pressure-sensitive sensor 6B" in some cases.

The cable type piezoelectric body 50 forming the pressure-sensitive sensor 6B includes an extruded and molded conductive rubber 60 having a circular cross-sectional surface (an exact circle or a substantially exact circle in the present embodiment) and a piezoelectric layer 61 formed on an outer peripheral surface of the conductive rubber 60. As the conductive rubber 60, for example, a material that is formed by adding carbon particles to a mixture of thermoplastic elastomers (TPE) and polypropylene (PP) so that a volume resistivity is 0.05 Ω·cm to 0.10 Ω·cm is used.

This piezoelectric layer 61 is made of a piezoelectric coating material applied onto an outer peripheral surface of the conductive rubber 60. More specifically, the piezoelectric layer 61 is made of a piezoelectric coating material that is sprayed onto the outer peripheral surface of the conductive rubber 60 by using a spray gun. In other words, the piezoelectric layer 61 is a coating film of the piezoelectric coating material formed on the outer peripheral surface of the conductive rubber 60. As the piezoelectric coating material, for example, a material formed by adding lead zirconate titanate (PZT) ceramic powders into an epoxy resin can be used.

As shown in FIG. 4, an end of a lead wire 71 functioning as a first connecting wire is connected to an end surface of the cable type first piezoelectric body 51, and an end of a lead wire 72 functioning as a second connecting wire is connected to an end surface of the cable type second piezoelectric body 52. More specifically, the end of the lead wire 71 is connected to an end surface of the conductive rubber 60 included in the cable type first piezoelectric body 51, and the end of the lead wire 72 is connected to an end surface of the conductive rubber 60 included in the cable type second piezoelectric body 52. Each of the other ends of these lead wires 71 and 72 is connected to a voltage measuring unit 7b. In other words, the conductive rubber 60 included in the cable type first piezoelectric body 51 is connected to the voltage measuring unit 7b through the lead wire 71. And, the conductive rubber 60 included in the cable type second piezoelectric body 52 is connected to the voltage measuring unit 7b through the lead wire 72. That is, the conductive rubber 60 included in the cable type first piezoelectric body 51 is an electrode connecting the piezoelectric layer 61 included in the cable type first piezoelectric body 51 and the voltage measuring unit 7b, and the conductive rubber 60 included in the cable type second piezoelectric body 52 is an electrode connecting the piezoelectric layer 61 included in the cable type second piezoelectric body 52 and the voltage measuring unit 7b.

As shown in FIG. 5, when a pressure is applied to at least either one of the piezoelectric layer 61 included in the cable type first piezoelectric body 51 and the piezoelectric layer 61 included in the cable type second piezoelectric body 52, a potential difference (voltage) is generated between the cable type first piezoelectric body 51 and the cable type second piezoelectric body 52 by a piezoelectric effect. And, the potential difference (voltage) generated between the cable type first piezoelectric body 51 and the cable type second piezoelectric body 52 can be measured by using the voltage measuring unit 7b (FIG. 4) connected to the piezoelectric bodies. Therefore, the pressure-sensitive sensor 6A shown in FIG. 1 can be replaced with the pressure-sensitive sensor 6B according to the present embodiment. That is, on the basis of a detection result of the pressure-sensitive sensor 6B according to the present embodiment, the pinching by the slide door 3 of the vehicle 1 can be detected. And, when the pinching is detected, the slide door 3 can be stopped, and be driven to open.

The pressure-sensitive sensor 6B according to the present embodiment has the conductive rubber 60 having the rubber elasticity and the piezoelectric layer 61 formed in a periphery of the conductive rubber 60, and the piezoelectric layer 61 is made of the piezoelectric coating material. Therefore, deformation of the conductive rubber 60 is not inhibited by the piezoelectric layer 61, so that flexibility and bendability are excellent as a whole. The piezoelectric layer 61 can be formed by only applying the piezoelectric coating material onto a surface of the conductive rubber 60, and therefore, the cable type piezoelectric body 50 including the piezoelectric layer 61 can be easily manufactured in a short time, thus, the pressure-sensitive sensor 6B including a pair of the cable type piezoelectric bodies 50 can be easily manufactured in a short time.

Further, in the pressure-sensitive sensor 6B according to the present embodiment, the conductive rubber 60 having the rubber elasticity functions as an electrode electrically connecting the cable type piezoelectric body 50 and an external device (the voltage measuring unit 7b in the present embodiment). Therefore, a possibility of causing damage on an electrode by an external force is very low. The piezoelectric layer 61 that is the coating film made of the piezoelectric coating material flexibly follows the deformation (extension/shrinkage and bending) of the conductive rubber 60 that is the electrode. Therefore, a possibility of peeling off of the piezoelectric layer 61 from the conductive rubber 60 that is the electrode is also very low. Totally, the pressure-sensitive sensor 6B according to the present embodiment has excellent flexibility, bendability and endurance.

In addition, the pressure-sensitive sensor 6B according to the present embodiment has two cable type piezoelectric bodies 50 (the cable type first piezoelectric body 51 and the cable type second piezoelectric body 52), and each of the cable type piezoelectric bodies 50 independently includes the conductive rubber 60 functioning as the electrode. Therefore, each of the cable type first piezoelectric body 51 and the cable type second piezoelectric body 52 is smaller in a diameter than one cable type piezoelectric body having one conductive rubber whose cross-sectional area is almost equal to a total cross-sectional area of the conductive rubbers 60 that are independently included in the cable type piezoelectric bodies, and is better than that in the flexibility and the bendability.

Third Embodiment

Next, still another embodiment example of a piezoelectric member of the present invention will be explained in detail with reference to FIG. 6. Incidentally, a piezoelectric member according to the present embodiment has the same basic configuration as that of the piezoelectric member (pressure-sensitive sensor 6B) according to the second embodiment. Accordingly, in the following explanation, the piezoelectric member according to the present embodiment is referred to as "pressure-sensitive sensor 6C", and differences between the pressure-sensitive sensor 6C according to the present embodiment and the pressure-sensitive sensor 6B according to the second embodiment will be mainly explained. In the same or substantially same configuration as the already-explained configurations, the same reference symbols will be used.

Figure 6:
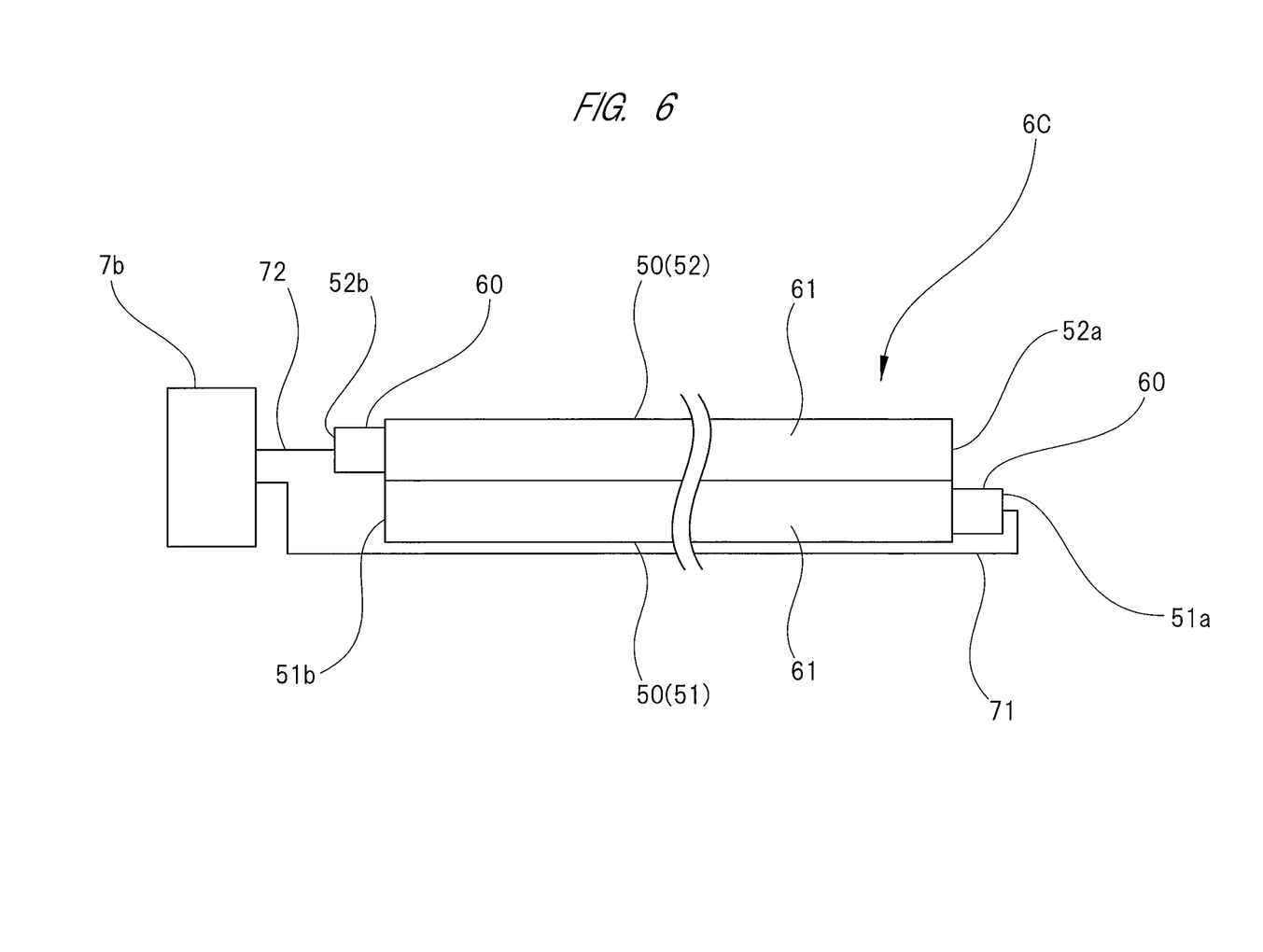
FIG. 6 is an explanatory diagram showing a third embodiment of the present invention.

With reference to FIG. 6, as similar to the pressure-sensitive sensor 6B (FIGS. 4 and 5) according to the second embodiment, the pressure-sensitive sensor 6C according to the present embodiment includes a cable type first piezoelectric body 51 and a cable type second piezoelectric body 52 that are arranged in parallel to each other, and lead wires 71 and 72 that connect the voltage measuring unit 7b and these cable type first and second piezoelectric bodies 51 and 52.

However, the pressure-sensitive sensor 6C according to the present embodiment is different from the pressure-sensitive sensor 6B according to the second embodiment in a drawing direction of the lead wire 71 relative to the cable type first piezoelectric body 51. Hereinafter, the explanation will be specifically made. As shown in FIG. 6, the lead wire 71 in the pressure-sensitive sensor 6C is drawn out from the first end surface 51a of the cable type first piezoelectric body 51, and is connected to the voltage measuring unit 7b. On the other hand, the lead wire 72 in the pressure-sensitive sensor 6C is drawn out from the second end surface 52b of the cable type second piezoelectric body 52, and is connected to the voltage measuring unit 7b.

Here, the cable type first piezoelectric body 51 includes a second end surface 51b positioned on an opposite side of the first end surface 51a from which the lead wire 71 is drawn out. And, the cable type second piezoelectric body 52 includes a first end surface 52a positioned on an opposite side of the second end surface 52b from which the lead wire 72 is drawn out. That is, the cable type first piezoelectric body 51 and the cable type second piezoelectric body 52 include the first end surfaces 51a and 52a and the second end surfaces 51b and 52b, respectively. The first end surfaces 51a and 52a of the cable type first piezoelectric body 51 and the cable type second piezoelectric body 52 are positioned on the same side (on a right side of a sheet of FIG. 6) as each other in a longitudinal direction of the pressure-sensitive sensor 6C, and the second end surfaces 51b and 52b of the cable type first piezoelectric body 51 and the cable type second piezoelectric body 52 are positioned on the same side (on a left side of the sheet of FIG. 6) as each other in the longitudinal direction of the pressure-sensitive sensor 6C. That is, the first end surface 51a of the cable type first piezoelectric body 51 from which the lead wire 71 is drawn out and the second end surface 52b of the cable type second piezoelectric body 52 from which the lead wire 72 is drawn out are positioned on the opposite side to each other in the longitudinal direction (a right-and-left direction of the sheet of FIG. 6) of the pressure-sensitive sensor 6C.

The lead wire 71 that is drawn out from the first end surface 51a of the cable type first piezoelectric body 51 is routed along the cable type first piezoelectric body 51 toward a side on which the second end surface 52b of the cable type second piezoelectric body 52 is positioned (the left side of the sheet of FIG. 6), and then, is connected to the voltage measuring unit 7*b*. On the other hand, the lead wire 72 that is drawn out from the second end surface 52*b* of the cable type second piezoelectric body 52 is not routed as different from the lead wire 71 (without direction change), and is directly connected to the voltage measuring unit 7*b*.

As described above, the lead wires 71 and 72 in the pressure-sensitive sensor 6C according to the present embodiment are finally drawn out in the same direction (the left direction of the sheet of FIG. 6) as each other relative to the entire pressure-sensitive sensor 6C. On the other hand, the lead wire 71 is drawn out in one direction relative to the cable type piezoelectric bodies 51 and 52 while the lead wire 72 is drawn out in the other direction relative to the cable type piezoelectric bodies 51 and 52, so that they are drawn out in an opposite direction to each other. In this manner, since two lead wires 71 and 72 are drawn out in the same direction as each other relative to the entire pressure-sensitive sensor 6C, connection between the pressure-sensitive sensor 6C and the external device is easy.

Fourth Embodiment

Next, still another embodiment example of a piezoelectric member of the present invention will be explained in detail with reference to FIG. 7. Incidentally, the piezoelectric member according to the present embodiment has the same basic configuration as that of the piezoelectric member (pressure-sensitive sensor 6B) according to the second embodiment. Accordingly, in the following explanation, the piezoelectric member according to the present embodiment is referred to as "pressure-sensitive sensor 6D", and differences between the pressure-sensitive sensor 6D according to the present embodiment and the pressure-sensitive sensor 6B according to the second embodiment will be mainly explained. In the same or substantially same configuration as the already-explained configurations, the same reference symbols will be used.

Figure 7:
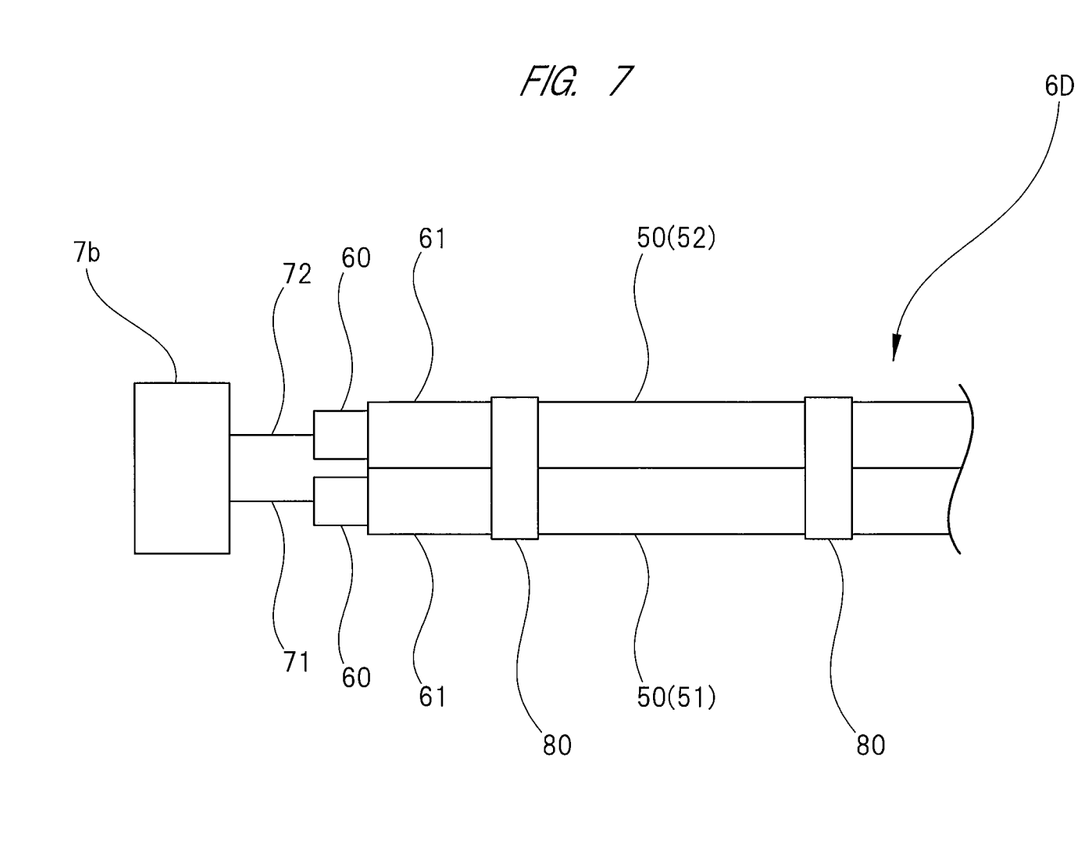
FIG. 7 is an explanatory diagram showing a fourth embodiment of the present invention.

As shown in FIG. 7, in the pressure-sensitive sensor 6D according to the present embodiment, the cable type first piezoelectric body 51 and the cable type second piezoelectric body 52 are fixed to each other at one or more portions (two portions in the present embodiment) of them in the longitudinal direction. More specifically, the cable type first piezoelectric body 51 and the cable type second piezoelectric body 52 are fixed to each other by a circular fixing tool 80 arranged at each of the two portions in the longitudinal direction of the cable type first piezoelectric body 51 and the cable type second piezoelectric body 52.

In the pressure-sensitive sensor 6D according to the present embodiment in which the cable type first piezoelectric body 51 and the cable type second piezoelectric body 52 are fixed to each other, a voltage is generated by not only the external pressure but also other oscillations. That is, even if any object is not in contact with the cable type first piezoelectric body 51 and the cable type second piezoelectric body 52, when these cable type piezoelectric bodies 51 and 52 oscillate, a pressure is applied by this oscillation to the piezoelectric layer 61 (FIG. 5) included in the cable type piezoelectric bodies 51 and 52, and a potential difference (voltage) is generated between the cable type piezoelectric bodies 51 and 52. Therefore, the piezoelectric member according to the present embodiment can be used as not only the pressure-sensitive sensors but also an oscillation sensor and an oscillation power generator.

Figure 8:
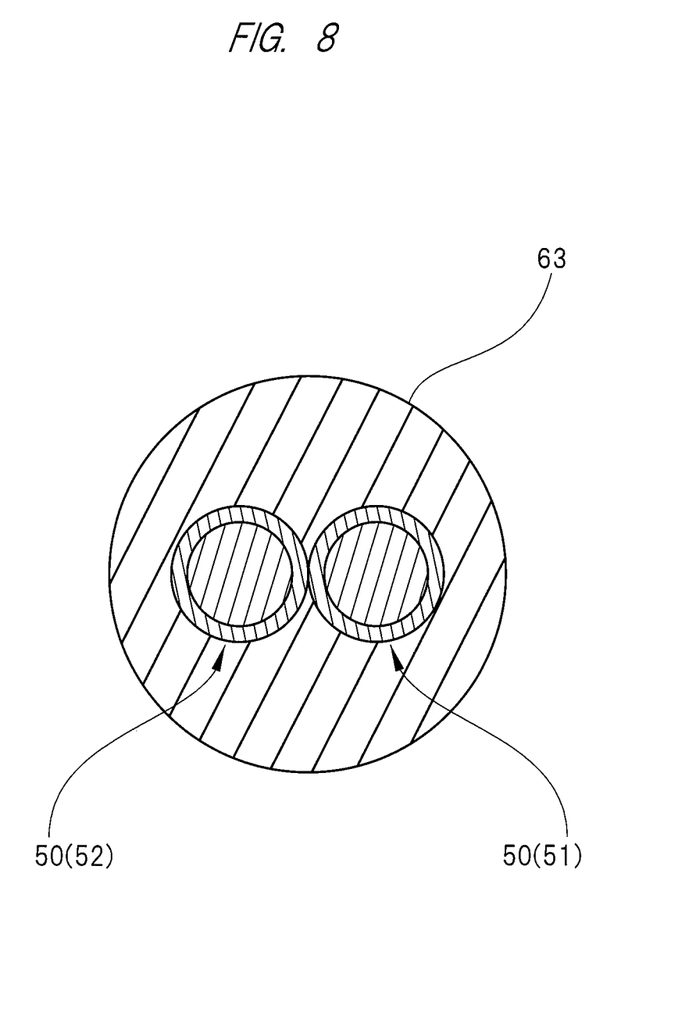
FIG. 8 is a cross-sectional view showing one example of a protective layer.
Figure 9:
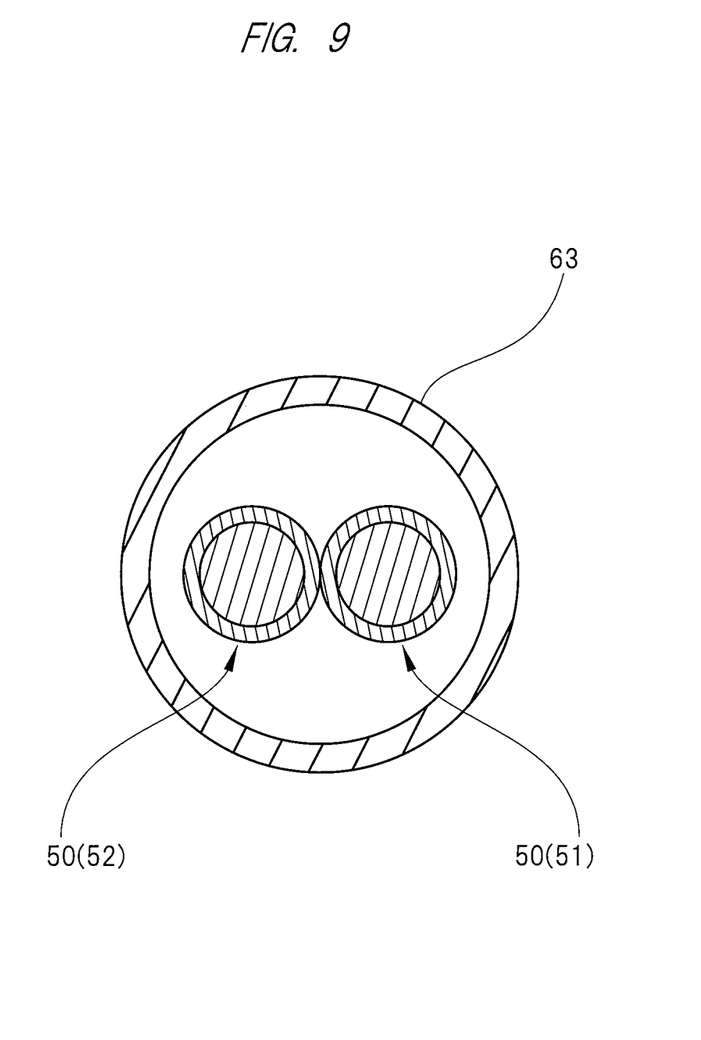
FIG. 9 is a cross-sectional view showing another example of the protective layer.
Figure 10:
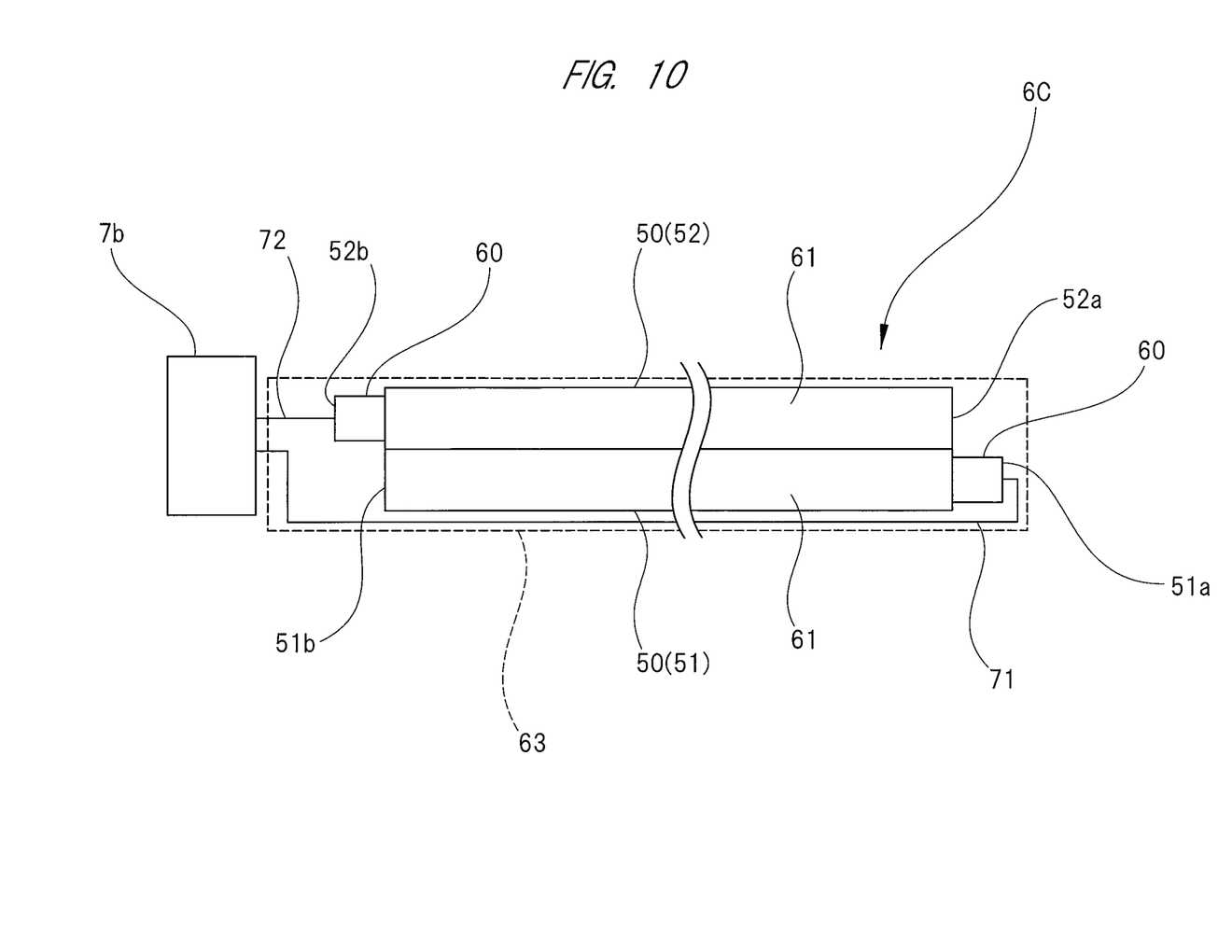
FIG. 10 is an explanatory diagram showing a modification example of a pressure-sensitive sensor shown in FIG. 6.

The present invention is not limited to the above-described embodiments, and various modifications can be made within the scope of the present invention. For example, the cable type first piezoelectric body 51 and the cable type second piezoelectric body 52 configuring the pressure-sensitive sensor 6B shown in FIGS. 4 and 5 may be stranded together. Alternatively, a protective layer for collectively covering the cable type first piezoelectric body 51 and the cable type second piezoelectric body 52 may be formed in a periphery of the cable type first piezoelectric body 51 and the cable type second piezoelectric body 52. One example of such a protective layer is shown in FIGS. 8 and 9. A protective layer 63 shown in FIG. 8 is a sheath that is extruded and molded in the periphery of the cable type first piezoelectric body 51 and the cable type second piezoelectric body 52. Meanwhile, a protective layer shown in FIG. 9 is a tube in which the cable type first piezoelectric body 51 and the cable type second piezoelectric body 52 are inserted. The sheath (FIG. 8) and the tube (FIG. 9) functioning as the protective layer 63 can be made of, for example, polyvinyl chloride (PVC) or urethane. Note that the protective layer formed of the sheath or the tube may be formed in an object obtained by stranding the cable type first piezoelectric body 51 and the cable type second piezoelectric body 52 together.

When the protective layer 63 is formed in the cable type first piezoelectric body 51 and the cable type second piezoelectric body 52 configuring the pressure-sensitive sensor 6C shown in FIG. 6, it is preferable to collectively cover not only the cable type first piezoelectric body 51 and the cable type second piezoelectric body 52 but also the lead wire 71 functioning as the first connecting wire. In this manner, a routing work becomes easy, and a risk of disconnection of the lead wire 71 can be reduced.

A metallic wire, an enamel wire, a resin wire, or others functioning as a tension member may be embedded in the cable type first piezoelectric body 51 and the cable type second piezoelectric body 52. It is preferable to arrange such a tension member at a center of the conductive rubber 60 included in the cable type first piezoelectric body 51 and the cable type second piezoelectric body 52.

In the embodiment shown in FIG. 6, while the lead wire 71 is routed along the cable type first piezoelectric body 51, the lead wire 72 is not drawn as different from the lead wire 71. However, an embodiment in which the lead wire 71 is not routed as different from the lead wire 72 while the lead wire 72 is routed along the cable type second piezoelectric body 52 is also applicable.

What is claimed is:

1. A piezoelectric member comprising:
   a belt type first conductive rubber sheet and a belt type second conductive rubber sheet having respective main surfaces that face each other; and
   a piezoelectric layer formed between the main surface of the first conductive rubber sheet and the main surface of the second conductive rubber sheet,
   wherein the piezoelectric layer is made of a piezoelectric coating material with which at least either one of the main surface of the first conductive rubber sheet and the main surface of the second conductive rubber sheet is coated, and,
   when a pressure is applied to the piezoelectric layer through at least either one of the first conductive rubber sheet and the second conductive rubber sheet, a potential difference is generated between the first conductive rubber sheet and the second conductive rubber sheet, and
   each of the first conductive rubber sheet and the second conductive rubber sheet is made of a conductive rubber formed by adding carbon particles to a mixture of thermoplastic elastomer and polypropylene so that a volume resistivity is 0.05 Ω·cm to 0.10 Ω·cm.

2. A piezoelectric member comprising:

a cable type first piezoelectric body and a cable type second piezoelectric body that are adjacent to each other, wherein each of the cable type first piezoelectric body and the cable type second piezoelectric body includes a conductive rubber having a circular cross section, and a piezoelectric layer formed on an outer peripheral surface of the conductive rubber, the piezoelectric layer is made of a piezoelectric coating material with which the outer peripheral surface of the conductive rubber is coated, and, when a pressure is applied to at least either one of the piezoelectric layer of the cable type first piezoelectric body and the piezoelectric layer of the cable type second piezoelectric body, a potential difference is generated between the cable type first piezoelectric body and the cable type second piezoelectric body, and the conductive rubber is a mixture of thermoplastic elastomer and polypropylene to which carbon particles are added so that a volume resistivity is 0.05 Ω·cm to 0.10 Ω·cm.

3. The piezoelectric member according to claim 2, wherein the cable type first piezoelectric body and the cable type second piezoelectric body are arranged in parallel to each other.

4. The piezoelectric member according to claim 2, wherein the cable type first piezoelectric body and the cable type second piezoelectric body are stranded together.

5. The piezoelectric member according to claim 2, further comprising a protective layer collectively covering the cable type first piezoelectric body and the cable type second piezoelectric body.

6. The piezoelectric member according to claim 5, further comprising:

a first connecting wire drawn out from a first end surface of the cable type first piezoelectric body; and a second connecting wire drawn out from a second end surface of the cable type second piezoelectric body, wherein the first end surface of the cable type first piezoelectric body and the second end surface of the cable type second piezoelectric body are opposite to each other in a longitudinal direction of the piezoelectric member, the first connecting wire is routed along the cable type first piezoelectric body toward a side on which the second end surface of the cable type second piezoelectric body is positioned, and the cable type first piezoelectric body, the cable type second piezoelectric body and the first connecting wire are collectively covered by the protective layer.

7. The piezoelectric member according to claim 2, wherein the cable type first piezoelectric body and the cable type second piezoelectric body are fixed to each other at one or more portions of the cable type first piezoelectric body and the cable type second piezoelectric body in a longitudinal direction.

8. The piezoelectric member according to claim 1, wherein, in a cross-sectional view, widths of the first conductive rubber sheet, the second conductive rubber sheet and the piezoelectric layer are same as one another.

9. The piezoelectric member according to claim 1, wherein the piezoelectric coating material is formed by adding lead zirconate titanate (PZT) ceramic powders into an epoxy resin.

10. The piezoelectric member according to claim 2, wherein the piezoelectric coating material is formed by adding lead zirconate titanate (PZT) ceramic powders into an epoxy resin.

\* \* \* \* \*